United States Patent [19]

Walters et al.

[11] Patent Number: 4,864,126

[45] Date of Patent: Sep. 5, 1989

[54] SOLID STATE RELAY WITH OPTICALLY CONTROLLED SHUNT AND SERIES ENHANCEMENT CIRCUIT

[75] Inventors: Michael D. Walters, San Jose; Joseph Pernyeszi, Scotts Valley; John F. Petrilla, Palo Alto, all of Calif.

[73] Assignee: Hewlett-Packard Company, Palo Alto, Calif.

[21] Appl. No.: 207,809

[22] Filed: Jun. 17, 1988

[51] Int. Cl.[4] ............................................. G02B 27/00
[52] U.S. Cl. ..................................... 250/551; 307/311
[58] Field of Search ................ 250/251, 551; 307/311

[56] References Cited

U.S. PATENT DOCUMENTS

| | | | |
|---|---|---|---|
| 4,390,790 | 6/1983 | Rodriguez | 250/551 |
| 4,564,770 | 1/1986 | Sherman et al. | 307/311 |
| 4,754,175 | 6/1988 | Kobayashi et al. | 307/311 |
| 4,777,387 | 10/1988 | Collins | 307/311 |
| 4,804,866 | 2/1989 | Akiyama | 307/311 |

FOREIGN PATENT DOCUMENTS

| | | | |
|---|---|---|---|
| 0015924 | 1/1987 | Japan | 307/311 |
| 0025511 | 2/1987 | Japan | 307/311 |
| 2154820 | 9/1985 | United Kingdom | 307/311 |

OTHER PUBLICATIONS

HEWLETT-PACKARD COMPANY, Optoelectronics/Fiber Optics Applications Manual, Second Ed., 1981, pp. 3.5-3.9.

Primary Examiner—David C. Nelms
Assistant Examiner—Eric F. Chatmon
Attorney, Agent, or Firm—Douglas A. Kundrat

[57] ABSTRACT

A solid state relay uses an optically controlled shunt and series enhancement circuit between a photodiode array and an output device to provide enhanced turn-off and transient immunity characteristics. A Faraday shield may be used to cover optically active components and to provide protection against false turn-on and turn-off caused by the transients.

16 Claims, 7 Drawing Sheets

SOLID STATE RELAY WITH OPTICALLY CONTROLLED SHUNT AND SERIES ENHANCEMENT CIRCUIT

BACKGROUND AND SUMMARY OF THE INVENTION

A solid state relay provides isolation between a control circuit and a switched circuit and may replace an electromechanical device such as a reed relay. A typical solid state relay consists of a light emitting diode (LED) optically coupled across an electrically isolating gap to a photodiode array. The photodiode array is electrically connected to a output device such as a field effect transistor (FET). Light from the LED creates a voltage across the photodiode array and activates the output FET.

Presently available solid state relays often are susceptible to electrical transients and have relatively slow turn-off characteristics. For example, the relay disclosed in U.S. Pat. No. 4,390,790 to Rodriguez includes a photodiode array directly connected to an output FET. Rodriguez's use of a turnoff transistor to discharge the output FET gate to source capacitance provides some improvement in turn-off speed but provides no transient protection to the relay. Relays such as this are vulnerable not only to transient propagation between the control and switched circuits but also to transient induced false turn-on and turn-off.

In accordance with the illustrated preferred embodiment of the present invention a solid state relay has improved turn-off characteristics and a high degree of transient immunity. The relay includes an optically controlled active series and shunt enhancement circuit located between the photodiode array and a pair of output FETs. Series phototransistors in the enhancement circuit actively couple and decouple the array from the output FETs at turn-on and turn-off. A shunt FET and a shunt silicon controlled rectifier (SCR) create rapid discharge paths for the output FET gate to source capacitances at turn-off. A shunt transistor is capacitively coupled to the relay output to protect against transient induced false turn-ons.

In an alternate preferred embodiment the solid state relay includes a shield over the photodiode array. Use of the shield allows direct and close optical coupling between the LED and the photodiode array so that high speed can be achieved at low required LED currents. The shield is both optically transmissive and electrically conductive and is connected to ground or to another neutral part of the relay circuit. The shield is positioned to intercept control circuit transients so that false turn-on caused by electrical activation of the photodiode array or other components can be avoided.

DETAILED DESCRIPTION OF THE PREFERRED EMBODIMENT

Figure 1:
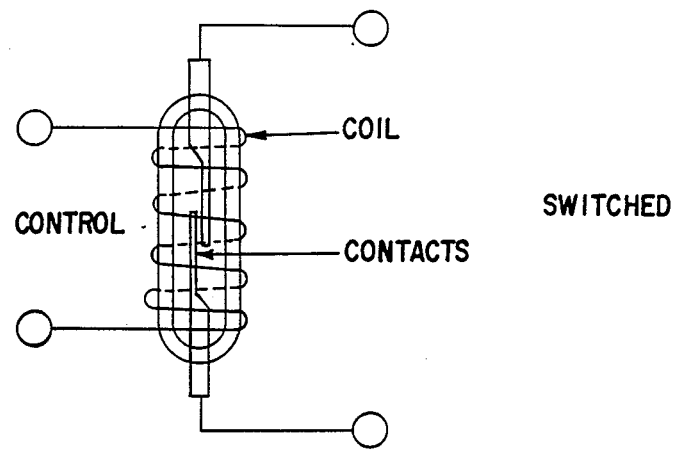
FIG. 1 shows a prior art mechanical relay.

FIG. 1 shows a well known reed relay that may be used to provide isolation between a control circuit and a switched circuit. Electromechanical devices such as reed relays have inherent disadvantages due to the use of mechanical moving parts.

Figure 2:
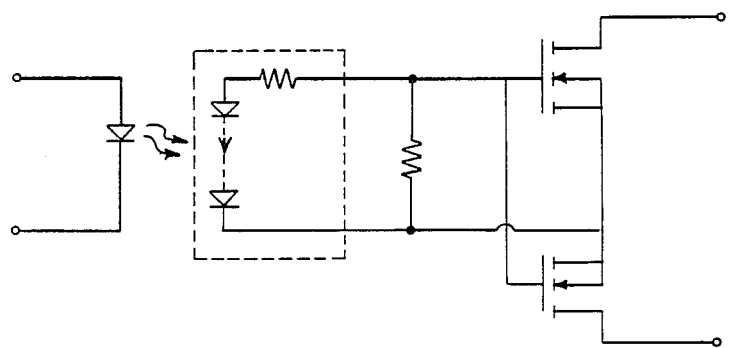
FIGS. 2 and 3 show prior art solid state relays.
Figure 3:
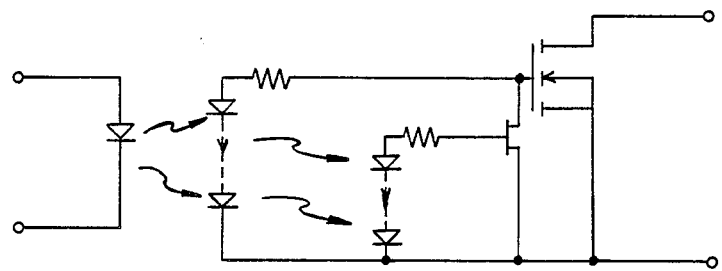

FIG. 2 is a schematic diagram of a prior art solid state relay disclosed by Rodriguez in U.S. Pat. No. 4,390,790. Activation of the LED by the control circuit creates a voltage across the photodiode array which turns on the output FETs. The shunt resistor accelerates the discharge of the FET capacitances at turn-off but slows turn-on of the relay. FIG. 3 is a schematic diagram of another prior art solid state relay disclosed by the Rodriguez patent. The shunt resistor is replaced by a shunt FET which is activated by a second photodiode array.

Figure 4:
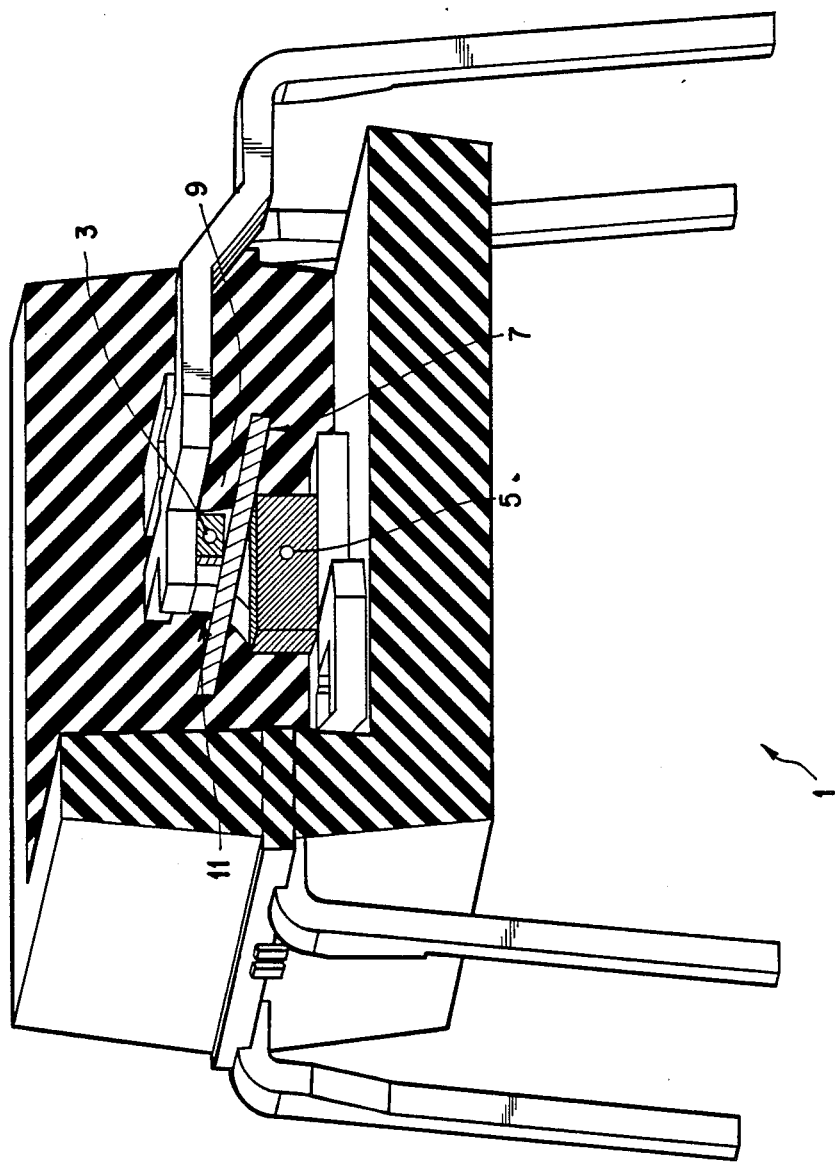
FIG. 4 is a cut away view of the package of a solid state relay constructed in accordance with the preferred embodiment of the present invention.

FIG. 4 is a cut-away view of a packaged solid state relay 1 constructed in accordance with a preferred embodiment of the present invention. The relay 1 may be constructed using known lead frame technology of the type disclosed in U.S. Pat. No. 4,694,183 issued on Sept. 15, 1987 to Merrick, et. al. An LED 3 is separated from an integrated circuit (IC) 5 containing the remainder of the relay circuitry by a gap 9 including an optically transmissive light guide 11 and an insulating film 7. Total relay 1 input to output resistance is approximately 50 gigaohms. Of course, LED 3 could be located in the same plane as IC 5 and gap 9 would then be a curved path rather than the straight path shown in FIG. 4 for face-to-face positioning.

Figure 5:
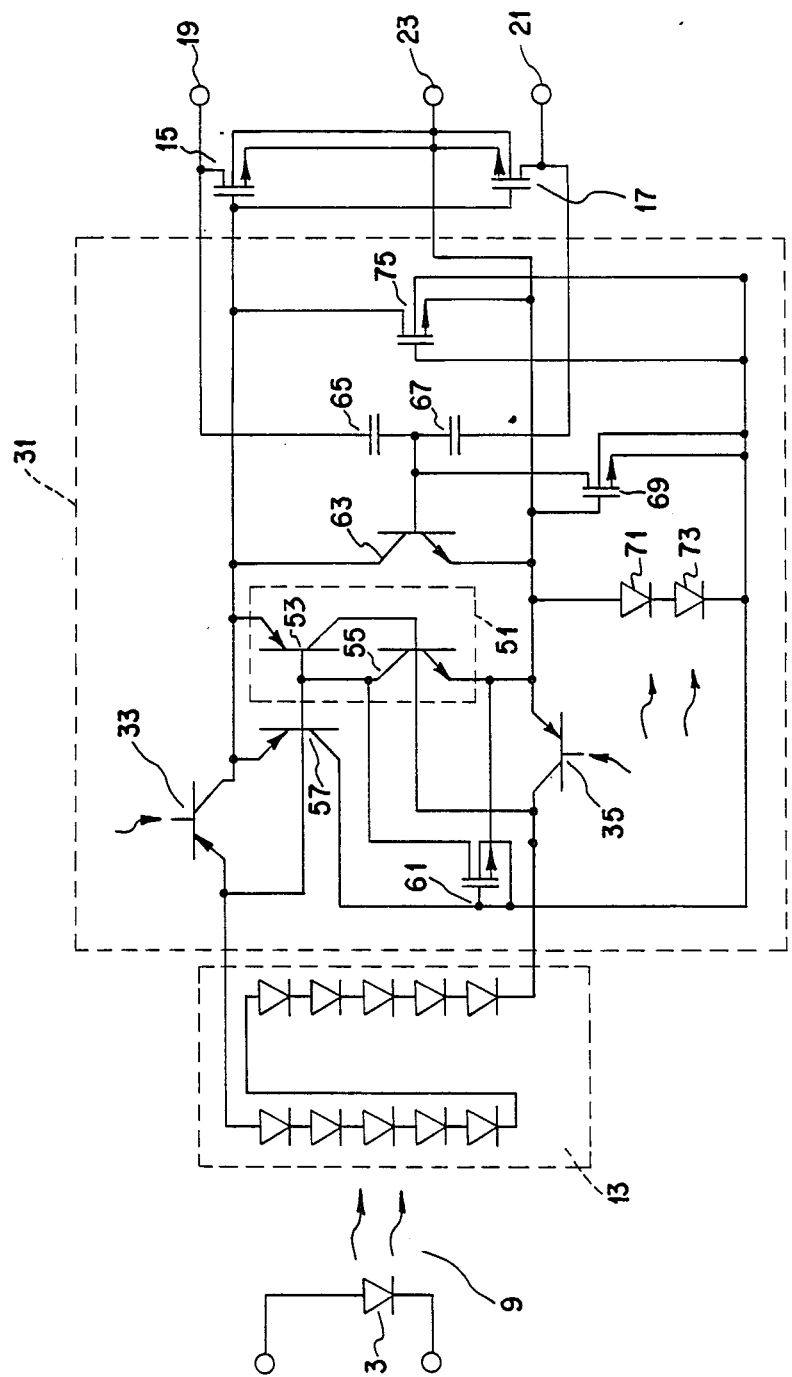
FIG. 5 is a schematic diagram of the solid state relay shown in FIG. 4.

FIG. 5 is a schematic diagram of the relay 1 shown in FIG. 4. The entire circuit, except for LED 3, is fabricated as one IC 5 on a single silicon chip. Known dielectric isolation techniques, described in U.S. Pat. No. 4,390,790 are used to provide necessary electrical isolation between various components of the circuit. A photodiode array 13 has ten individual photodiodes and generates an on-voltage of approximately 5 volts in response to a 5 mA current through LED 3. This on-voltage is coupled, through phototransistors 33 and 35, across the gates-to-sources of output FETs 15 and 17. These output FETs 15, 17 are vertical double diffused MOS (DMOS) devices constructed in dielectric isolation tubs. The sources of the two FETs 13, 15 are connected together to achieve the desired high, 230 volt, bilateral breakdown voltage despite the existence of parasitic diodes between the sources and drains. Output on-resistance is approximately 200 ohms. Output terminals 19, 21 provide a low impedance path when the relay 1 is on and allow connection to the circuit to be switched. Source terminal 23 may be a ground or neutral connection of the switched circuit. The voltage at terminal 23 will remain one diode drop voltage (about 0.7 volts) above the lower of the voltages at terminal 19 or 21. Alternatively, in D.C. switching (between terminal 23 and either of terminals 19 or 21) terminal 23 will remain at the most negative voltage of any of the three terminals.

Figure 6:
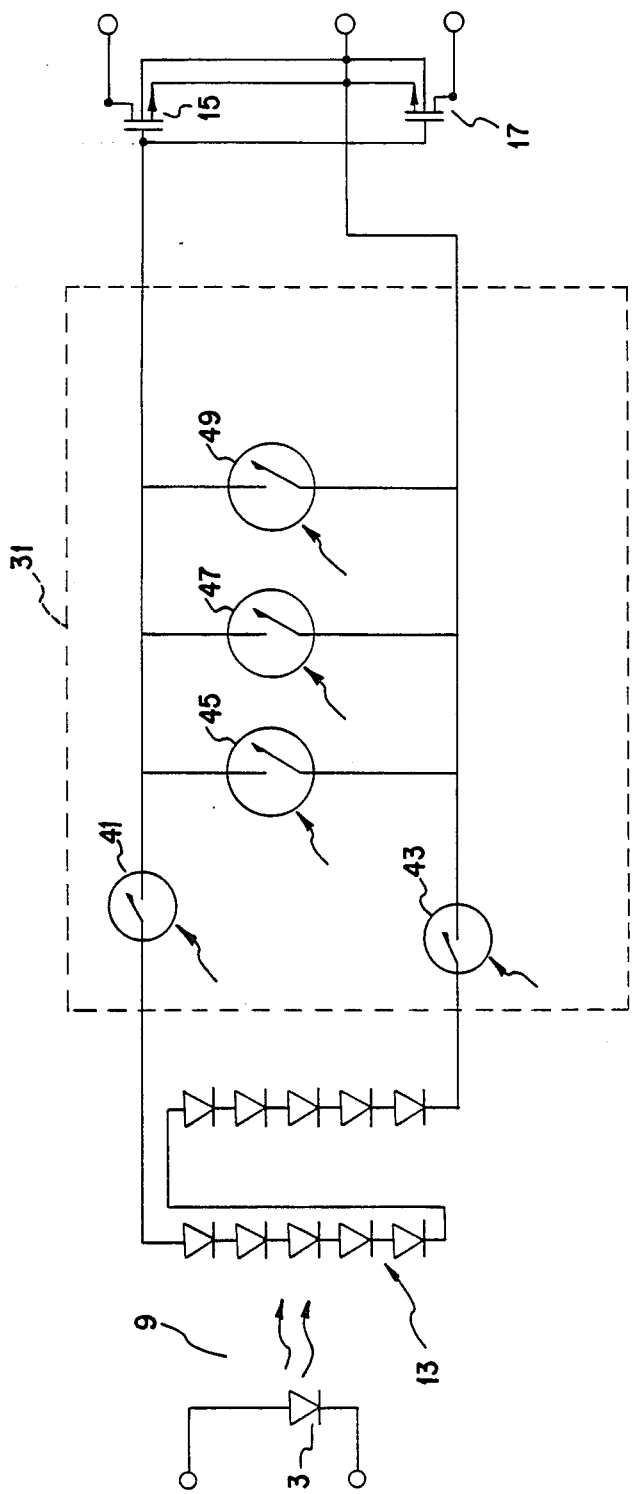
FIG. 6 shows a block diagram representation of the enhancement circuit shown in FIG. 5.

FIG. 6 is a block diagram representation of an enhancement circuit 31 located between the array 13 and the output FETs 15, 17 shown in FIG. 5. The enhancement circuit 31 provides enhanced turn-on less (less than 250 microseconds), turn-off (less than 100 microseconds) and transient immunity characteristics to the relay 1. Operationally, circuit 31 may be modelled as a series and shunt combination of optically controlled active switches including series switches 41, 43 and shunt switches 45, 47 and 49.

The interconnections of enhancement circuit 31 are shown in FIGS. 5 and 6. Switches 41 and 43 are two series phototransistors 33, 35 which couple and decouple the gates and sources of the output FETs 15, 17 from the photodiode array 13. Switch 45 is a silicon controlled rectifier 51 made up of transistors 53, 55. SCR 51 is connected from gates to sources of the output FETs 15, 17 and is controlled by the phototransistors 33, 35 and a FET 61. The base-emitter junction of pnp transistor 57 is connected across phototransistor 33 and the collector is connected to the gate of FET 61. Switch 47 is a transistor 63 connected across the gate to source path of the output FETs 15, 17. The base of transistor 63 is capacitively coupled through capacitors 65, 67 to the output terminals 19, 21, and is also connected to the drain of a FET 69. Photodiodes 71, 73 are activated by light from LED 3 and are connected from the gate to the source of FET 69. Switch 49 is a FET 75 shunting the gate to source of the output FETs 15, 17 and controlled by photodiodes 71, 73.

In order to turn relay 1 on, a current is passed through LED 3 causing it to emit light. This light is coupled across gap 9 to array 13 which presents a nominal 5 volts at the input to enhancement circuit 31. The light also activates phototransistors 33, 35 which couple the array 13 voltage to output FETs 15, 17. This voltage significantly exceeds the 1.1 volt threshhold of the FETs 15, 17 and ensures turn-on. The light from LED 3 illuminates photodiodes 71, 73 and causes them to generate a voltage of approximately 1 volt. This voltage turns off FET 75 (shunt switch 49) and FET 61 and turns on FET 69 which shunts the base-emitter junction of transistor 63 (switch 47) and turns it off.

In order to turn relay 1 off, the current to LED 3 is removed. This turns off LED 3 and causes the voltage across array 13 to collapse towards zero. The absence of light also turns off phototransistors 33, 35 (series switches 41, 43) and decouples the array 13 voltage from output FETs 15, 17. The collapse of the array 13 voltage turns on SCR 51 (switch 45) which discharges the output FET 15, 17 gate to source capacitance and accelerates turn-off of relay 1.

Turn-off is also accelerated by switches 47 and 49 (transistor 63 and FET 75). The turn-off of phototransistor 33 and the collapse of the array 13 voltage turns on transistor 57 which turns on FET 75 (shunt switch 49). FET 75 adds another discharge path to the gate to source capacitance of output FET 15, 17 and, in addition, completes the discharge when SCR 51 turns off as the output FETs 15, 17 voltage collapses below 0.7 volts. Transistor 57 also turns on transistor 61 to ensure the proper turn-on of SCR 51. When the output FET 15, 17 gate to source capacitance is sufficiently discharged, both output FETs 15, 17 turn off. When this occurs, the drain of one of the output FETs begins to move towards a positive voltage and this voltage change, through capacitor 65 or 67, causes transistor 63 to turn on. Conduction of transistor 63 further shunts the gates to sources of output FETs 15, 17. Current stops flowing in transistor 63 when the voltage change at terminals 19, 21 ceases.

Enhancement circuit 31 also provides significant transient protection to relay 1. In the off-state, a transient at either output terminal 19, 21 is capacitively coupled to the base of transistor 63 (shunt switch 49). This ensures that transistor 63 is turned on and precludes unintentional turn-on of either output FET 15, 17. Phototransistors 33, 35 provide on-state protection against unintentional turn-off due to a transient in the control circuit. The pnp phototransistors 33, 35 are symmetric and conduct equally well in the forward and reverse modes so that they continue to hold the SCR 51 off even in the presence of input transients.

Figure 7:
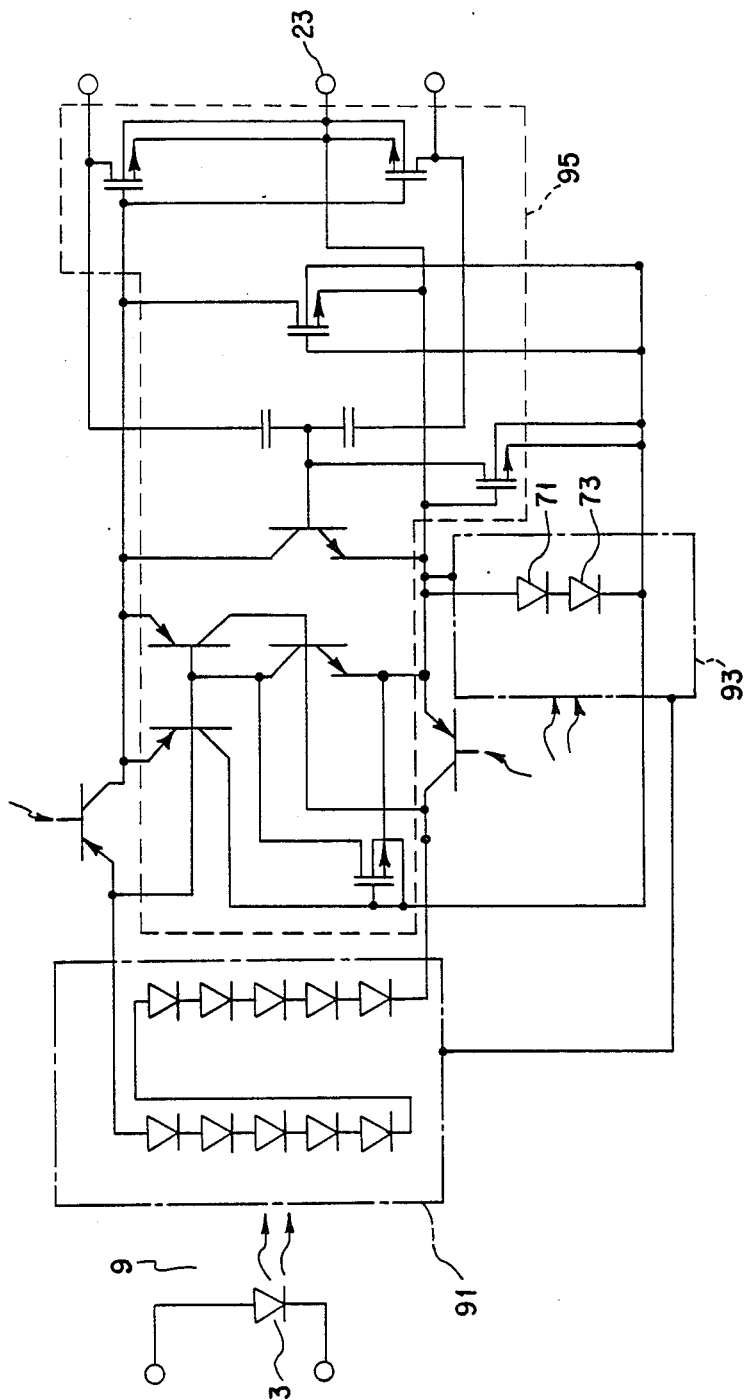
FIG. 7 is a schematic diagram of an alternate preferred embodiment of the present invention in which a shield is used.

FIG. 7 shows an alternate preferred embodiment of the present invention in which shields 91, 93 provide additional transient protection for relay 1. Shield 91 overlays photodiode array 13 and lies between array 13 and LED 3. Shield 93 overlays photodiodes 71, 73 and lies between photodiodes 71, 73 and LED 3. Both shields 91, 93 are physically connected to source terminal 21 or may be connected to a ground or neutral terminal of the circuit.

Shields 91, 93 are most advantageous if LED 3 and array 13 are positioned across a gap 9 instead of being coplanar. This face-to-face alignment allows maximum optical coupling and minimum required LED 3 drive current. It also increases undesired LED 3 to IC 5 capacitive coupling which increases transient susceptibility.

Shields 91 and 93 are optically transmissive and electrically conductive and may be viewed as Faraday shields in that they are conductive plates or ground planes that act to terminate electrical field lines emanating from the control circuit. Without shields 91, 93 an electrical transient entering relay 1 from the control circuit through the LED 3 connections could be capacitively coupled into the circuitry of relay 1 beyond array 11. The transient, positive or negative, could cause an unwanted false turn-on or turn-off of relay 1. With shields 91, 93 in place a positive or negative input transient is terminated on shield 91 or 93 and is shunted away from enhancement circuit 31 and the output FETs 15, 17.

FIG. 7 also shows a shadow mask 95 which overlays all of the active elements in IC 5 except for the areas covered by shields 91, 93 and phototransistors 33, 35. Shadow mask 95 is an optically absorbing layer that protects optically sensitive components such as SCR 51 from inadvertent turn on due to illumination by LED 3. Shadow mask 95 may be fabricated in accordance with the the techniques disclosed in copending U.S. patent application Ser. No. 149,766 filed on Jan. 29, 1988.

Figure 8:
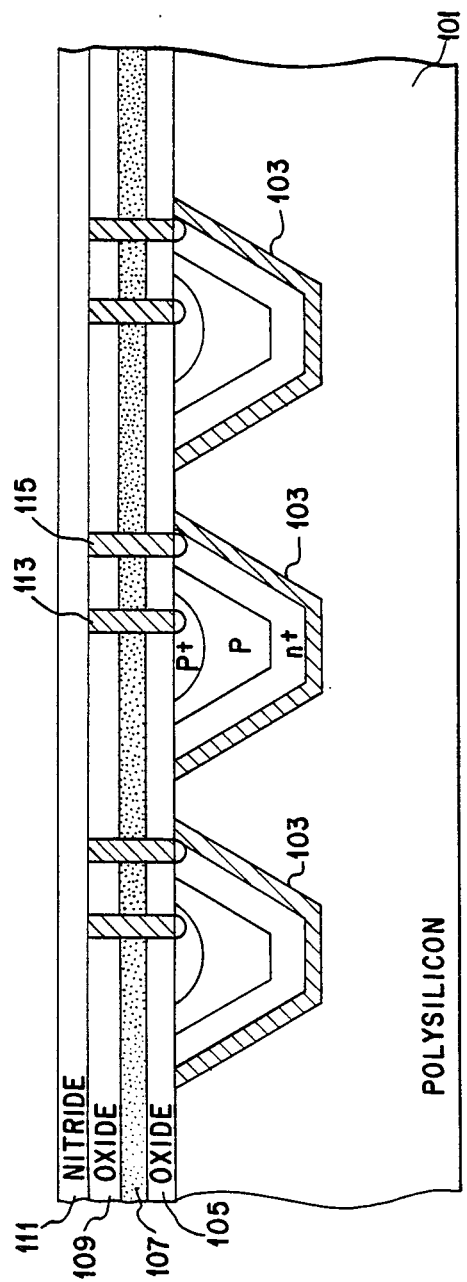
FIG. 8 is a cut away view of a portion of the physical circuit depicted in FIG. 7.

FIG. 8 is a cut-away view of IC 5 showing three of the photodiodes of array 13 in cross section. The individual photodiodes of array 13 are fabricated in a 500 micron thick polysilicon substrate 101 using dielectric isolation techniques similar to those used in fabrication of the Dionics Corporation model DIG-12-08-010 MOSFET Driver. Oxide liners 103 provide 25 micron deep tubs that allow dielectric isolation between each of the individual photodiodes. Overlaying the entire IC 5 are conventional passivation layers, which are optically transmissive, used in integrated circuit processing. An initial oxide layer 105 is followed by a nitride layer 111. A polysilicon layer 107 overlays the oxide layer 105 over the array 13 and the photodiodes 71, 73 to form shields 91, 93. A second oxide layer 109 is used in these areas to separate the polysilicon layer 107 from the nitride layer 111

The polysilicon layer 107 is approximately one-half micron thick. A thinner layer might have conformance difficulties over surface irregularities and would have increased electrical resistance. A thicker layer would cause increased optical attenuation. The half micron thickness provides a good operational compromise between the electrical and optical conditions. The polysilicon layer 107 transmits light best at wavelengths above 750 nanometers and has low optical attenuation at the 880 nanometer emission wavelength of LED 3. For lower emission wavelengths, other optically and electrically conductive materials such as indium tin oxide might be possible.

The polysilicon layer 107 may be deposited to form shields 91, 93 during the same processing step as the formation of the polysilicon gate regions of output FETs 15, 17 which may be similar to the IR Corporation IRF610 n-channel FET. If desired, the processing steps could be modified to allow deposition of another polysilicon shield layer over other optically active components such as phototransistors 33, 35. Contacts may be etched into shields 91, 93 to allow deposition of metal traces to connect shields 91, 93 to source terminal 23 as shown in FIG. 7. Metal conductors 113, 115 through layers 105-111 allow electrical connection to the individual photodiodes of array 13.

We claim:

1. A solid state relay comprising:
   a light emitting diode connectable to a control circuit;
   a primary photodiode array, optically coupled to the light emitting diode across a gap, for receiving light from the light emitting diode and for generating a voltage;
   an output device having inputs for receiving the voltage and output terminals connectable to a switched circuit, the output device providing a low impedance path between the output terminals in an on-state and a high impedance path in an off-state; and
   series switch means, connected between the photodiode array and the output device, for selectably coupling or decoupling the photodiode array to the output device.

2. A solid state relay as in claim 1, wherein the series switch means is controlled by light from the light emitting diode.

3. A solid state relay as in claim 2, wherein the series switch means comprises a phototransistor optically coupled across the gap to the light emitting diode.

4. A solid state relay as in claim 2, wherein:
   the output device comprises an output transistor having first and second inputs for receiving the voltage; and
   the series switch means comprises first and second phototransistors, the first phototransistor being connected between an end of the photodiode array and the first input of the output transistor, the second phototransistor being connected between an other end of the photodiode array and the second input of the output transistor.

5. A solid state relay as in claim 4, wherein the output device comprises first and second output field effect transistors connected gate to gate and source to source, the gates and sources forming the inputs.

6. A solid state relay as in claim 1, further comprising a first shunt switch means connected across the inputs of the output device for selectably discharging the output device.

7. A solid state relay as in claim 6, wherein the first shunt switch means is controlled by light from the light emitting diode.

8. A solid state relay as in claim 7, wherein the first shunt switch means is connected to and controlled by the series switch means.

9. A solid state relay as in claim 8, wherein the first shunt switch means comprises a silicon controlled rectifier.

10. A solid state relay as in claim 1, further comprising second shunt switch means for selectably discharging the output device, the second shunt switch means being connected across the inputs of the output device and having an input capacitively coupled to the output terminals of the output device.

11. A solid state relay as in claim 4, further comprising second shunt switch means for selectably discharging the output device, the second shunt switch means being connected across the inputs of the output device and having an .input capacitively coupled to the output terminals of the output device.

12. A solid state relay as in claim 10, wherein the second shunt switch means is optically controlled by the light emitting diode and is disabled by light emitted by the light emitting diode.

13. A solid state relay as in claim 12, wherein the second shunt switch means is optically controlled by the light emitting diode and is disabled by light emitted by the light emitting diode.

14. A solid state relay comprising:
    a light emitting diode connectable to a control circuit;
    a primary photodiode array, optically coupled to the light emitting diode across a gap, for receiving light from the light emitting diode and for generating a voltage;
    an output device having inputs for receiving the voltage and output terminals connectable to a switched circuit, the output device providing a low impedance path between the output terminals in an on-state and a high impedance path in an off-state; and
    second shunt switch means for selectably discharging the output device, the second shunt switch means being connected across the inputs of the output device and having an input capacitively coupled to the output terminals of the output device.

15. A solid state relay as in claim 14, wherein the second shunt switch means comprises a transistor.

16. A solid state relay as in claim 15, wherein the second shunt switch means is optically controlled by the light emitting diode and is disabled by light emitted by the light emitting diode.

* * * * *